United States Patent [19]
Choi et al.

[11] Patent Number: 5,654,213
[45] Date of Patent: Aug. 5, 1997

[54] METHOD FOR FABRICATING A CMOS DEVICE

[75] Inventors: Jeong Yeol Choi, Fremont; Chung-Jen Chien, Saratoga; Chung-Chyung Han, San Jose; Chuen-Der Lien, Los Altos, all of Calif.

[73] Assignee: Integrated Device Technology, Inc., Santa Clara, Calif.

[21] Appl. No.: 538,533

[22] Filed: Oct. 3, 1995

[51] Int. Cl.$^6$ .................................................. H01L 21/265
[52] U.S. Cl. .................. 438/227; 257/274; 257/369; 438/231; 438/228
[58] Field of Search .................... 437/44, 34, 56, 437/57, 58; 257/274, 369

[56] References Cited

U.S. PATENT DOCUMENTS

| | | | |
|---|---|---|---|
| 4,435,896 | 3/1984 | Parrillo et al. | 29/571 |
| 4,507,847 | 4/1985 | Sullivan | 29/576 |
| 4,753,898 | 6/1988 | Parrillo et al. | 437/57 |
| 4,764,477 | 8/1988 | Chang et al. | 437/44 |
| 4,771,014 | 9/1988 | Liou et al. | 437/44 |
| 4,906,588 | 3/1990 | Harrington, III | 437/44 |
| 4,968,639 | 11/1990 | Bergonzoni | 437/44 |
| 4,997,782 | 3/1991 | Bergonzoni | 437/44 |
| 5,006,476 | 4/1991 | De Jong et al. | 437/56 |
| 5,122,474 | 6/1992 | Harrington, III | 437/44 |
| 5,290,714 | 3/1994 | Onozawa | 437/34 |
| 5,393,677 | 2/1995 | Lien et al. | 437/28 |
| 5,405,791 | 4/1995 | Ahmad et al. | 437/34 |
| 5,484,739 | 1/1996 | Lee et al. | 437/34 |
| 5,500,379 | 3/1996 | Odake et al. | 437/57 |
| 5,532,176 | 7/1996 | Katada et al. | 437/34 |

OTHER PUBLICATIONS

Stanley Wolf, "Silicon Processing For The VLSI Era", 1990, vol. 2, pp. 387–389. 1990.

*Primary Examiner*—John Niebling
*Assistant Examiner*—Long Pham
*Attorney, Agent, or Firm*—Isabelle R. McAndrews

[57] ABSTRACT

A process for fabricating a CMOS structure using a single masking step to define lightly-doped source and drain regions for both N- and P-channel devices. The process forms disposable spacers adjacent to gate structures and at least one retrograde well. Retrograde wells are formed using one or more charged ions at different energy levels. In addition, heavily-doped source and drain regions are formed using blanket implants of two different conductivities into a semiconductor substrate having two contiguous wells of opposite conductivity type. By blanket implanting a first dopant into both wells, and then selectively implanting a second dopant, the diffusion of the second dopant is partially suppressed by the first dopant. The partial suppression of first dopant results in shallow implants being formed. Also disclosed is a process for forming contact openings and contact implants.

39 Claims, 7 Drawing Sheets

METHOD FOR FABRICATING A CMOS DEVICE

BACKGROUND OF THE INVENTION

CMOS technology has been continuously optimized for scaled-down devices to improve performance and high-level integration. Frequently, the optimizations are accompanied by an increase in the number of steps, resulting in a more complicated and costly product. Moreover, as the feature size of devices scale down, it is important to prevent punch-through between source and drain regions and between adjacent devices under the field oxide regions. Many different techniques have been employed in order to suppress punchthrough from occurring, including forming shallow junctions. However, shallow junctions are characterized by reduced source/drain implant doses that invariably cause the resistivity to increase.

The lithography in CMOS devices is considered to be the most expensive portion of the fabrication process. Lithography is also considered a bottleneck for throughput purposes as well. Typically, the prior art draws on additional steps to decrease cost or to reduce the number of masks required. For example, steps such as the number of implants, critical masking or critical etching are often increased to reduce cost or the number masks used in the fabrication of CMOS devices.

SUMMARY OF THE INVENTION

The present invention solves the disadvantages of the prior art by reducing the number of masks required to form a CMOS device in a cost-effective manner. The invention employs a blanket implant for doping one conductivity type region and over-compensates to produce a doped region of the other conductivity type with only one masking step. Gate structures with isolation regions and disposable spacers act as natural masks to allow selective doping to occur.

In addition, the invention provides a method for forming shallow implants by counterdoping without increasing resistivity above that produced by doping with smaller dosages of only a single dopant. Shallow implants are provided by introducing dopants of different conductivities into a semiconductor substrate having two contiguous wells of opposite conductivity. A first dopant of a first conductivity type is blanket implanted to form source and drain regions in each well; then a second dopant of a second conductivity type is selectively introduced into the source and drain regions of one of said wells to convert at least a portion of the source and drain regions therein to a second conductivity type.

The present invention is also directed to a method of forming lightly doped source and drain regions in a CMOS structure having contiguous wells, isolation regions and gates within a semiconductor substrate. This process is performed by a) introducing a first dopant of a first conductivity into both wells;

b) forming disposable side-wall spacers adjacent to at least one of said gates;

c) introducing a second dosage, higher than said first dosage, of a dopant of said first conductivity type into both wells to form heavily doped source and drain regions;

d) introducing a high dosage of a dopant of a second conductivity type in one of said wells to convert the source and drain regions in said one well to heavily-doped source and drain regions of said second conductivity type;

e) removing said disposable spacers from one of said gates; and f) providing a low dosage source and drain implant of a dopant of said second conductivity type in areas adjacent to said heavily doped source and drain regions of said second conductivity type.

DETAILED DESCRIPTION OF THE INVENTION

Figure 1:
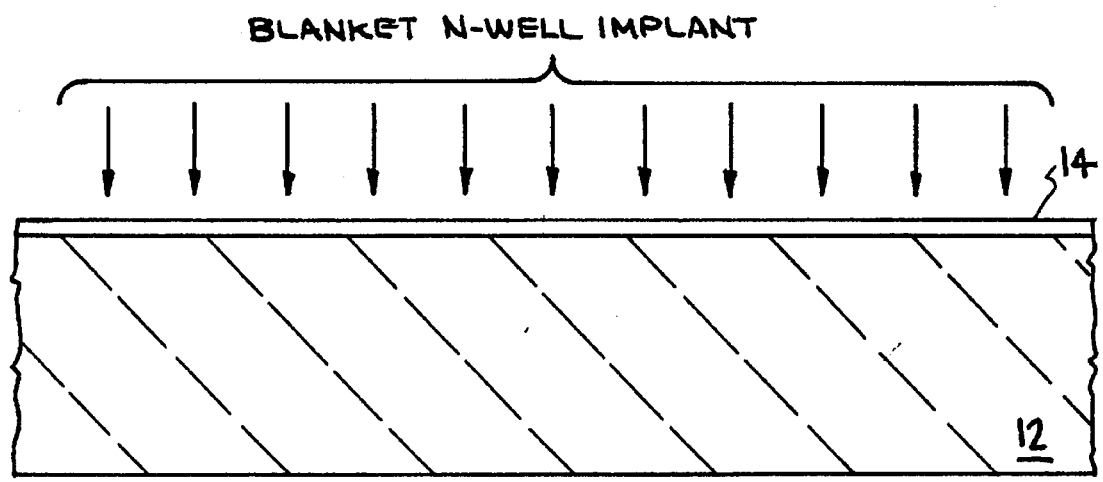
FIGS. 1 to 18 are cross-sectional views of a portion of a CMOS device fabricated in accordance with a preferred embodiment of the present invention.

In FIGS. 1 to 18 there are shown cross-sectional views of a semiconductor structure fabricated in accordance with a preferred embodiment of the present invention. FIG. 1 shows a thin layer of oxide, such as a silicon dioxide layer 14 thermally grown or deposited on a surface of a substrate 12. In this embodiment, the substrate (12) is blanket implanted with an n-type dopant. A preferred n-type dopant is arsenic. When driven into the substrate at high temperatures, the implanted dopants will form an n-well (20).

Figure 2:
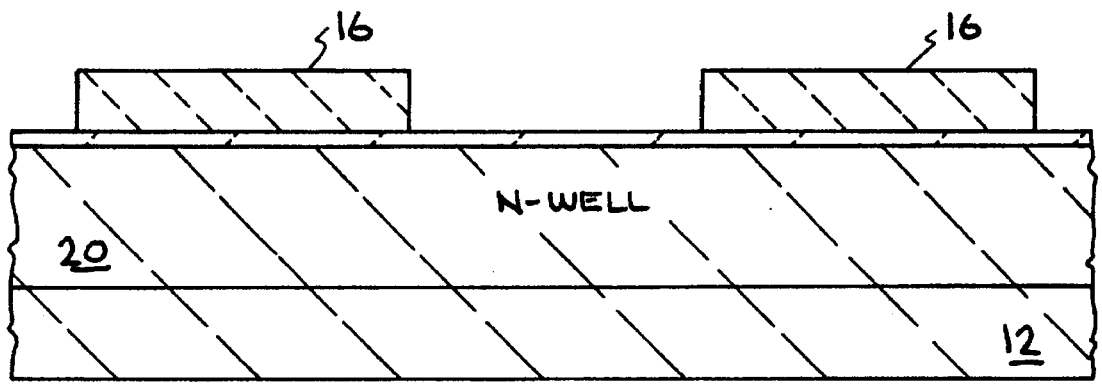
Figure 3:
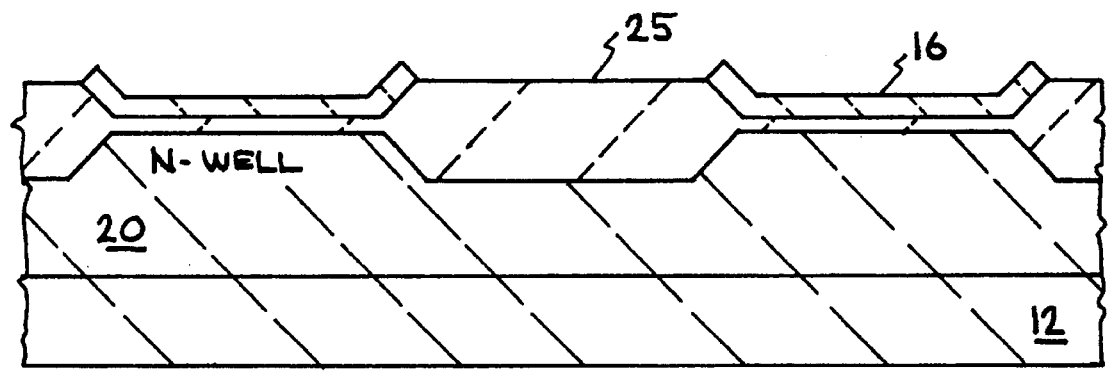
Figure 4:
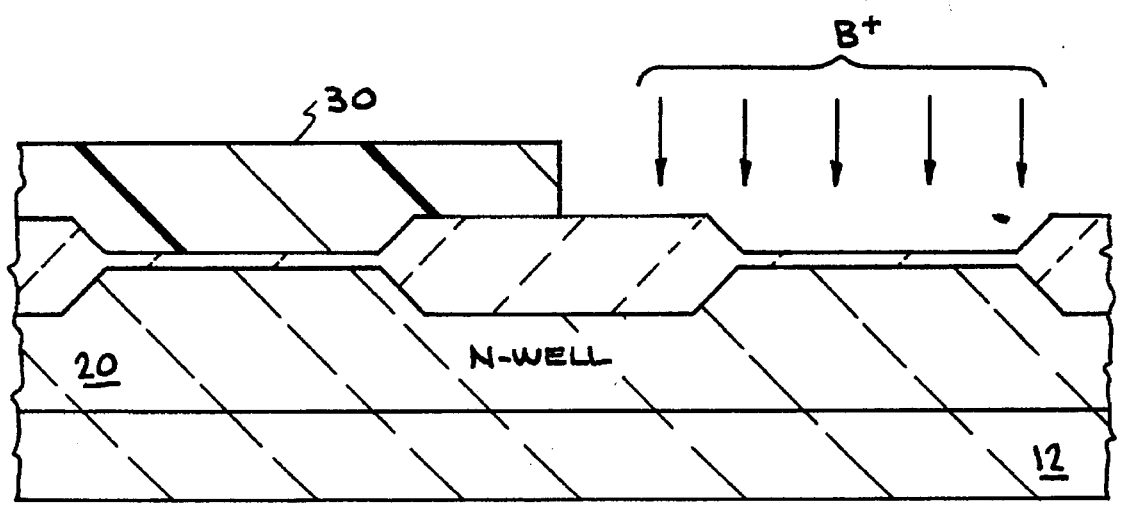

After the n-well (20) is formed, a silicon nitride layer (16) is deposited. FIG. 2 shows the semiconductor structure after it has been masked and the nitride layer etched to define isolation regions between what will become transistors. LOCOS isolation is achieved by thermally growing oxide to form isolation regions (25) shown in FIG. 3. The remaining nitride portions (16) are stripped away by an etchant that does not attack the field oxide regions. Turning now to FIG. 4, a portion of the semiconductor structure is masked with a photoresist 30, and photoresist 30 is patterned to define where a p-well will be located. In a preferred embodiment, the p-well will be a retrograde well. However, any conventional p-well will be suitable for practicing the invention.

The retrograde p-well is formed with a sequence of low energy and high energy implants of a p-type dopant. Any of the charged boron ions may be used as the p-type dopant, provided the boron ions are implanted within the approximate energy level ranges specified below. Thus, a singly-charged boron ion ($B^+$) may be used alone, provided the implanter is capable of implants at the higher energies specified for $B^{++}$ in the embodiment discussed below. Moreover, triply-charged boron ions may be used in conjunction with singly-charged boron ions ($B^+$) as well.

Figure 5:
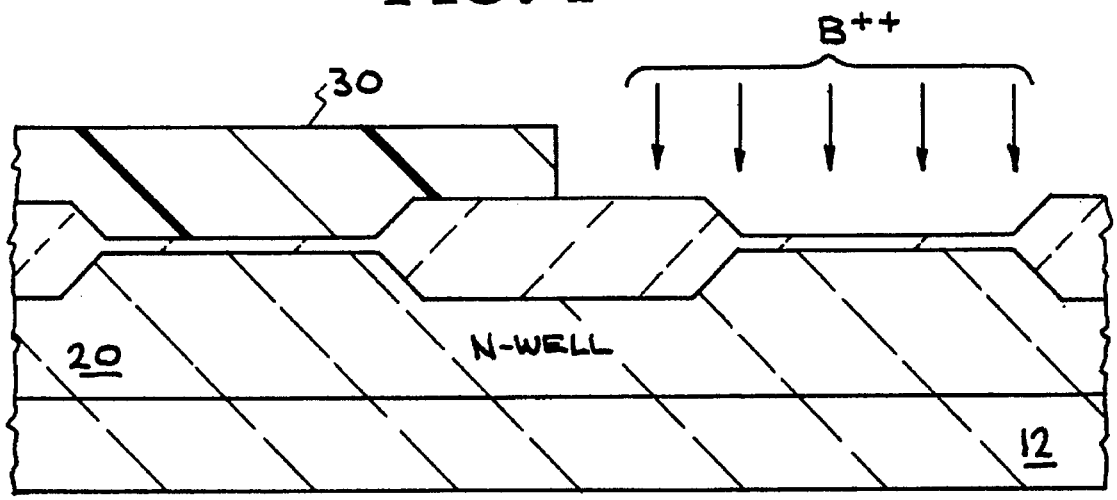
Figure 6:
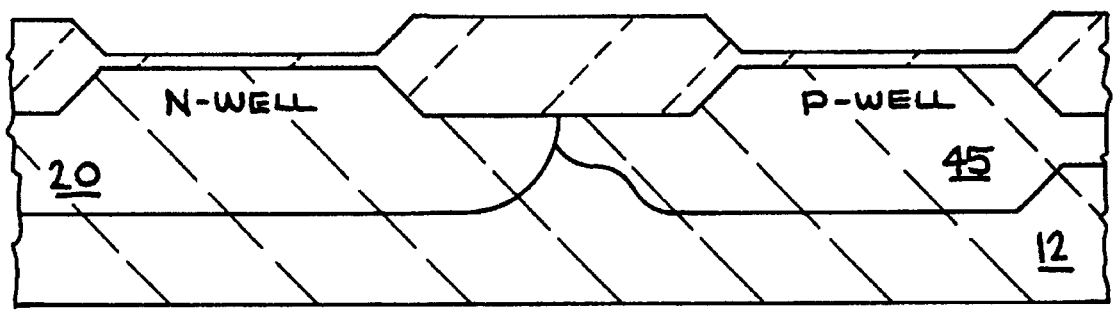

In a preferred embodiment, two low energy doses of $B^+$ (singly charged boron ion) are implanted as shown in FIG. 4 to suppress punch-through under the channel, and also to improve isolation. Exemplary energies for $B^+$ range from about 100–150 KeV, and from about 60–70 KeV for a second $B^+$ implant, which can be sequentially implanted. Preferably, two implants at energies of 60 KeV and 120 KeV are sequentially provided to implant the $B^+$ shown in FIG. 4. Thereafter, higher energy implants of $B^{++}$ (doubly charge boron ion) are performed as shown in FIG. 5. Specifically, $B^{++}$ is provided at energies of about 200–260 KeV in a first implant and from about 350–500 KeV in a second implant. Preferred implant energies for the two separate $B^{++}$ implants, shown in FIG. 5, are 240 KeV and 380 KeV. These higher energy implants are implanted through the field oxide. All together, four implantations are preferably used to form the p-well (45) adjacent to the previously formed n-well (20). As a result, two contiguous wells (20 and 45) of different conductivity type are formed as shown in FIG. 6 with only a single mask. As will be readily apparent to the skilled artisan, the dosage levels of the charged boron ions will be selected so as to be appropriate for forming p-wells. The dose of the highest energy implant should be chosen to suppress latch-up.

In the above examples lower energy implants precede higher energy implants. However, it is not necessary for the process of this invention that lower energy implants always precede higher energy implants. In short, higher energy implants that precede lower energy implants will also be suitable in forming a retrograde well in accordance with the invention.

In an alternative embodiment, the n-wells may also be retrograde wells. In this case, the retrograde n-well may be formed in a similar manner to the method described above for forming the retrograde p-well. Specifically, the blanket implant in FIG. 1 would be p-type. Alternatively, there need not be any implantation of dopant in the step shown in FIG. 1 and either the retrograde p- or n-well could be formed by blanket implantation after the isolation regions are formed. In this embodiment, a retrograde well of one conductivity would be formed by blanket implantation and the isolation regions (such as LOCOS) would be masked to provide a retrograde n- or p-well implant that overcompensates the previously formed retrograde p- or n-well implant.

Figure 7:
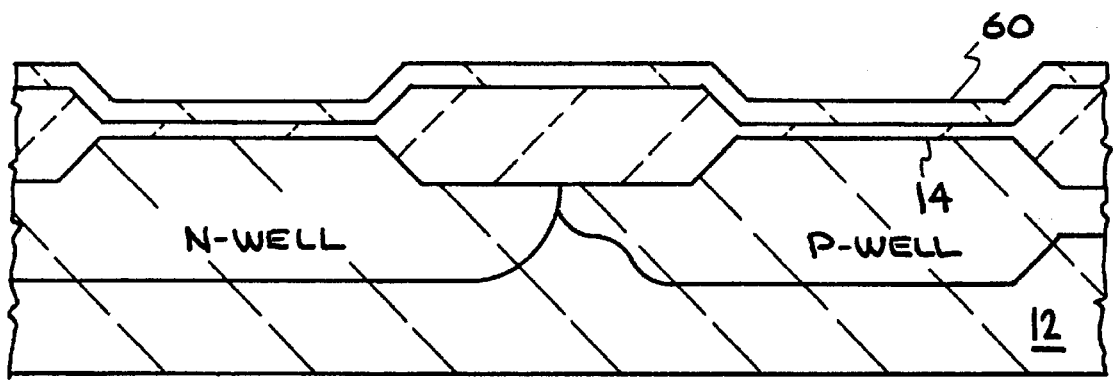
Figure 8:
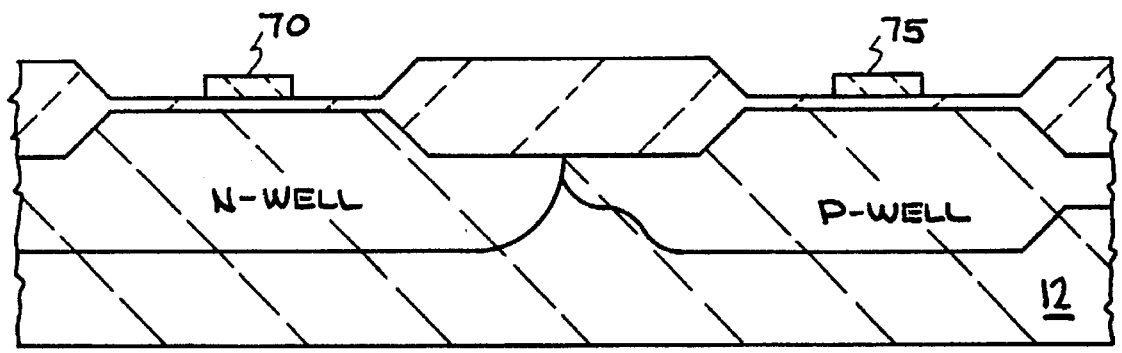
Figure 9:
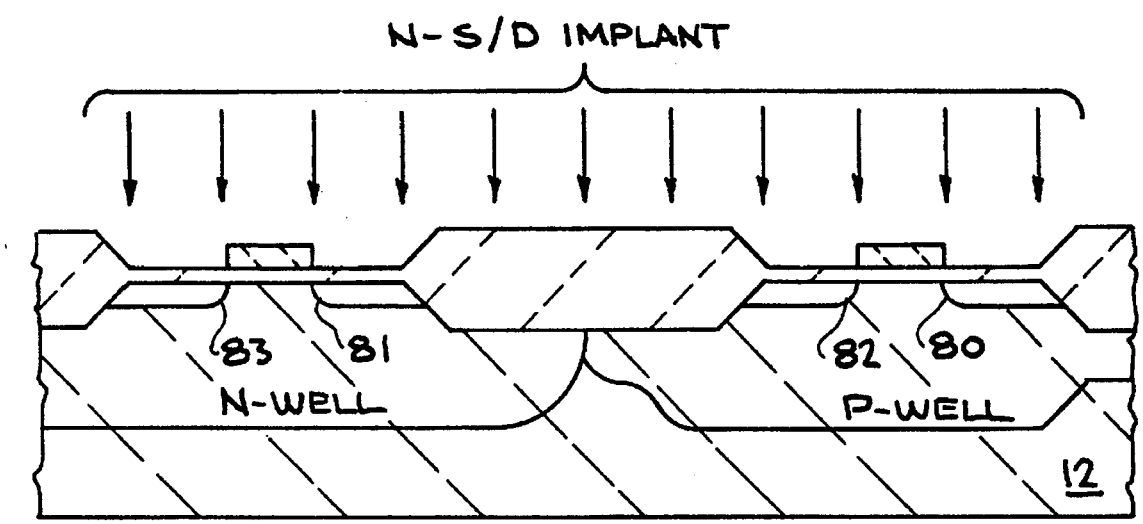

Subsequent to forming the wells, a layer of gate material (60) is deposited on the thin layer of oxide (14) by any suitable method, including sputtering or chemical vapor deposition, yielding the structure shown in FIG. 7. The gate material preferably consists of polysilicon. The gate material (60) may be doped using any known method, including in-situ doping, $POCl_3$ diffusion or ion implantation. The gate material is subsequently etched away using any appropriate means, including reactive ion etching, to form the gate structures (70 and 75) shown in FIG. 8. The gates and field oxide regions function as natural masks, enabling source and drain regions to be formed with blanket implants, self-aligned to the polysilicon gate. Turning to FIG. 9, lightly doped drains (LDDs) of a first conductivity type (80–83) are implanted in areas between the birds beak and the lateral edges of each gate structure. Low dosages of a dopant are introduced into both wells at a dose of approximately 1E13 atoms/cm$^2$ to 2E13 atoms/cm$^2$.

Figure 10:
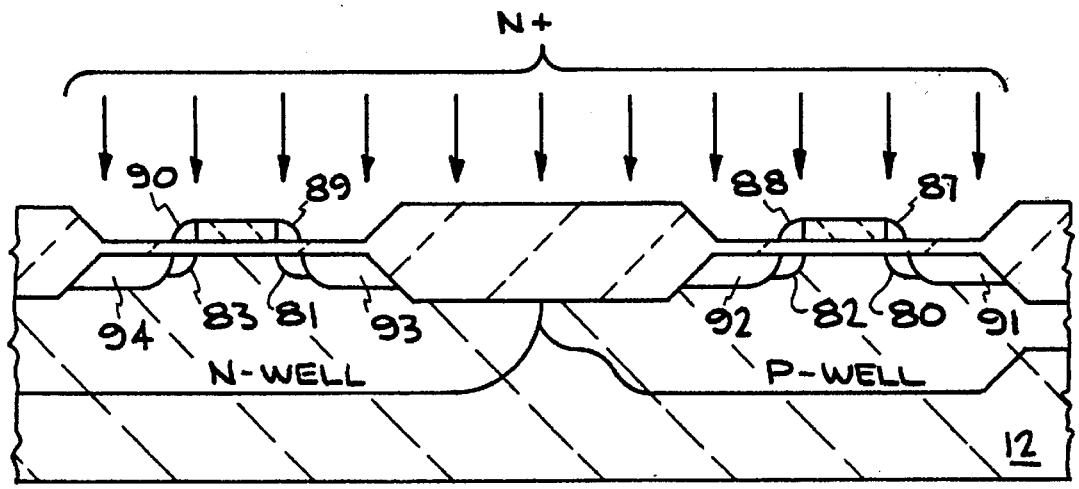
Figure 11:
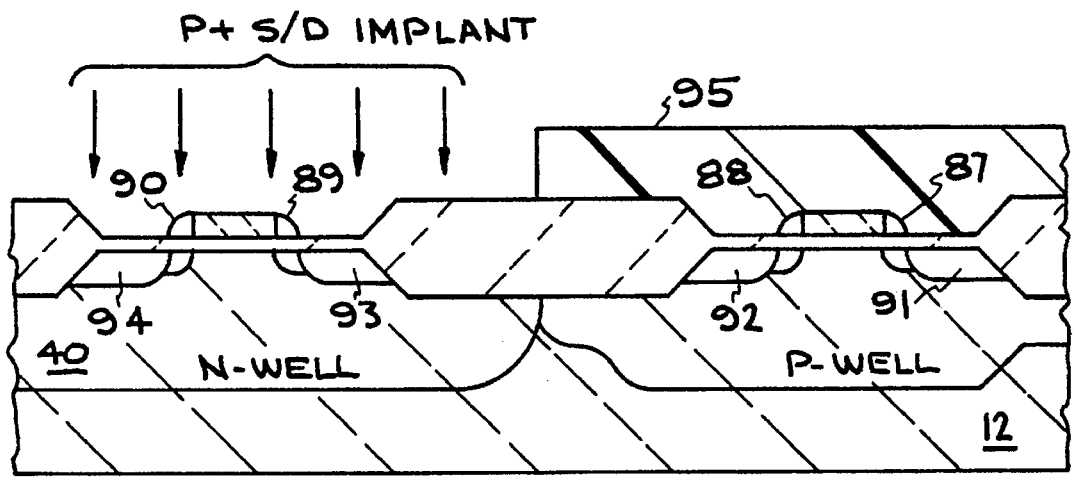

Turning to FIG. 10, sidewall spacers (87–90) are formed after the initial formation of LDDs. The sidewall spacers screen the LDDs from heavy implant doses. Thereafter, a dopant of a first conductivity is implanted at a high dosage to form source/drain regions 91–94. Suitable dosage levels at this step for an n-type dopant range from 1E15 to 8E15 atoms per cm$^2$. The sidewall spacers are preferably formed by depositing a layer of oxide (not shown), which is doped with an n-type dopant, such as phosphorous. RIE, or any other suitable method, may be used to etch the oxide layer, to thereby form sidewall spacers prior to forming the source/drain regions. The doped spacers impart a 100:1 selectivity to the doped spacer and the field oxide regions, permitting the field oxide to remain undisturbed during subsequent spacer removal. All of the source and drain regions shown in FIG. 10, including the LDD portions, are of the same conductivity.

The p-well is then masked with photoresist 95, and a heavy dosage of p-type dopant is implanted over n-well 40 (shown in FIG. 11) to overcompensate the n-type dopant; as a result, the n-type doped regions are converted to net p-type conductivity. Suitable dosage levels at this step for the p-type dopant range from 4E15 to 1E16 atoms per cm$^2$. Thus, the dopants for forming the source/drain regions (91–94) of both transistors are provided with only a single masking step. In addition, both source/drain regions (91–94) are formed with blanket implantation steps. A preferred p-type dopant is $BF_2^+$. Without removing the mask from the prior implantation (95), sidewall spacers (89 and 90) on the unmasked portion of the structure are removed with a wet etchant.

Figure 12:
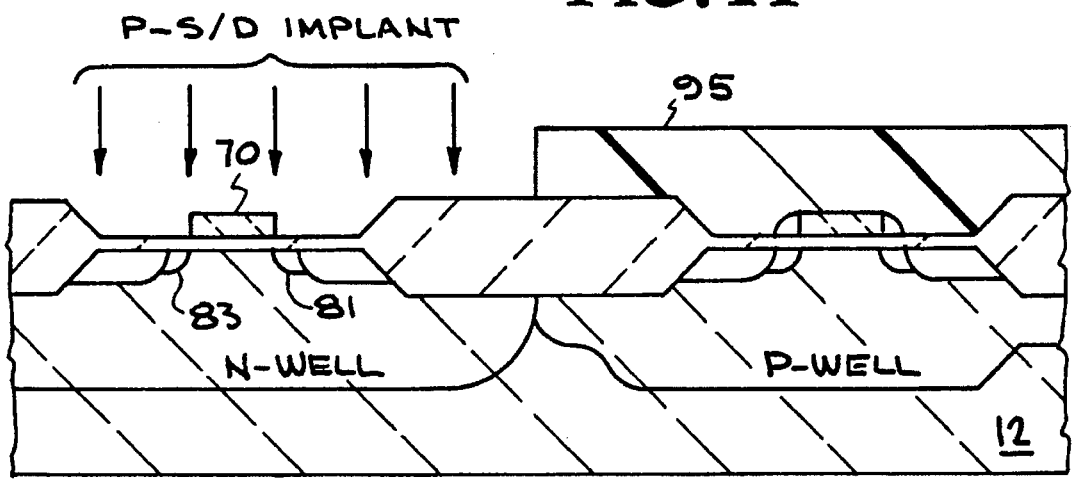

FIG. 12 illustrates the manner in which LDDs of p-type conductivity are provided. First, as noted above, the sidewalls (89 and 90) on the unmasked spacer (70) are stripped off. Without removing field oxide regions or the mask 95, p-type implants are introduced in areas where n-type LDDs were previously located. As a result, the conductivity of the LDDs 83 and 81 have their conductivity changed to net p-type. Preferably, the lightly doped implants will consist of $BF_2^+$, and are provided without the need for any further masking steps. The lightly doped implants are provided at a dosage level greater than the lightly doped implants described in reference to FIG. 9. Suitable dosage levels for the lightly doped source/drain regions shown in FIG. 12 range from approximately 3E13 atoms/cm$^2$ to approximately 14E13 atoms/cm$^2$. Subsequent to fabricating the LDD regions contact openings are formed. The sidewalls (87 and 88) masked by 95 remain intact throughout the remainder of the process.

Figure 13:
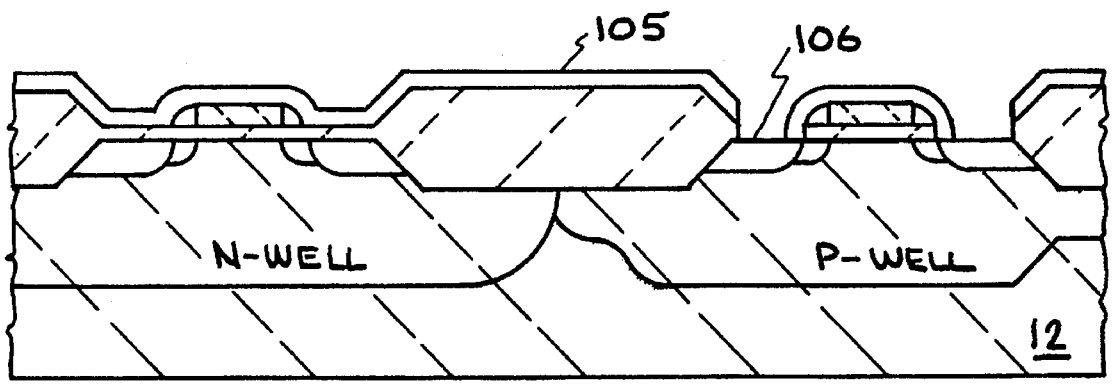
Figure 14:
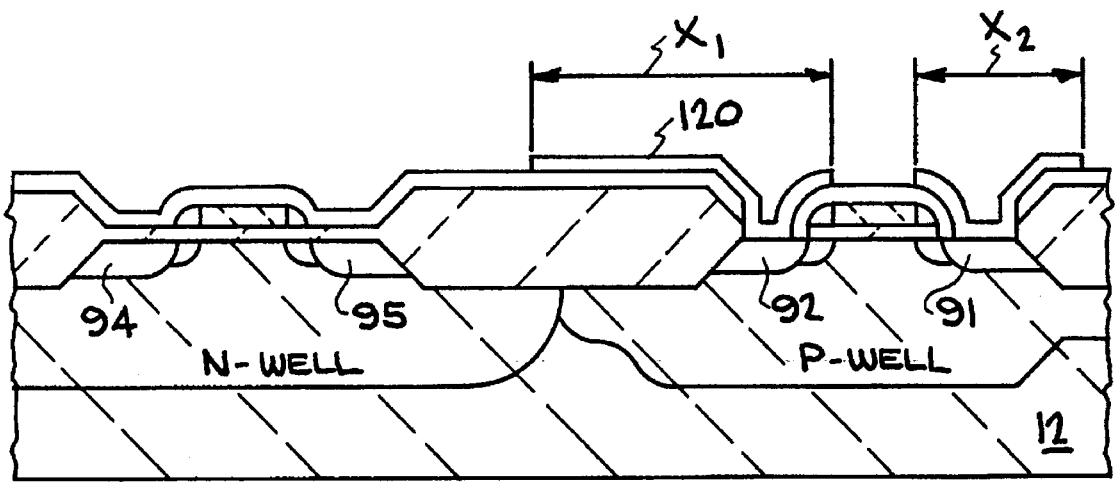
Figure 15:
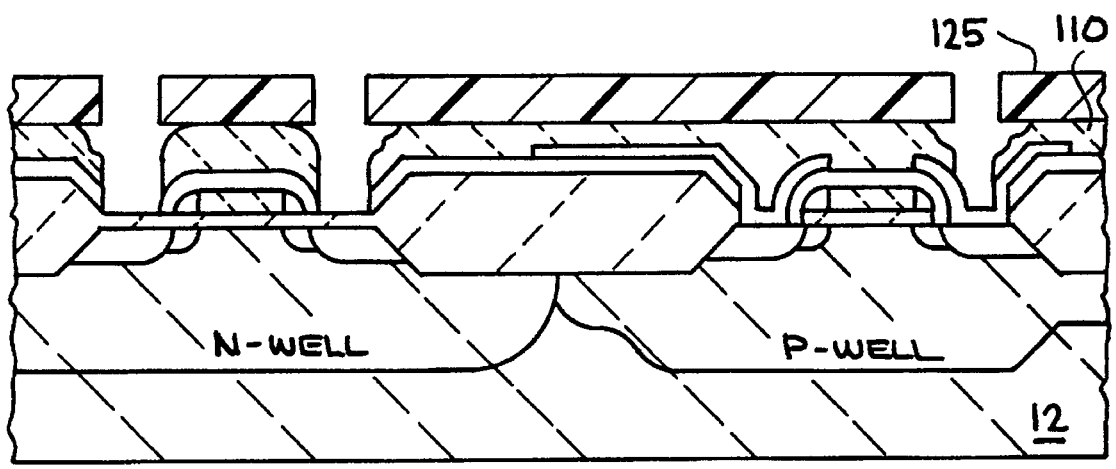

The sequence of steps performed in a preferred embodiment for forming contact openings in accordance with the invention is illustrated in FIGS. 13 through 15. Turning to FIG. 13, a thin layer of undoped oxide (105) is conformally deposited over the surface of the structure. If a second layer of polysilicon is desired, layer 105 will be etched to create a hole 106 as shown. FIG. 14 illustrates the optional embodiment of providing a second layer of polysilicon (Poly 2)(120). The purpose of layer 120 (poly-2) is to maximize yield and to safeguard against possibilities of misalignment. The poly-2(120) will protect the underlying gate and field regions in the event the contact mask is misaligned in a position that would risk creating contacts outside tolerances defined by the design rules. When desired, the poly-2 layer (120) is deposited on a layer of undoped oxide (105) as shown in FIG. 14. The poly-2 layer is masked and then etched so that it remains in the horizontal regions $x_1$ and $x_2$ shown in FIG. 14. In another embodiment the poly-2 layer may be masked so as to leave only a portion of the poly-2 layer in either horizontal region $x_1$ or horizontal region $x_2$. Using poly-2 will also improve the topography, in addition to the design rules for contact-to-gate spacing.

Depending on the geometric constraints imposed by the design rules, it may also be desirable to leave a portion of polysilicon above source and drain regions located in the N-well. In this case, the polysilicon left above the source and drain regions 94 and 95 is preferably doped with a p-type conductivity to form an ohmic contact. The polysilicon layer (120) can be doped either during deposition or after deposition. Of course, it is also possible to leave a portion of polysilicon above only source (or drain) region 94 and source (or drain) region 92. In summary, depending on the particular constraints of the design rules, all, or any number of the source and drain regions of the present invention may be protected with polysilicon (120).

One benefit of using poly-2 as described above is that one can construct the transistor with tighter tolerances. In a poly-2 process, more stringent tolerances are possible because the contact does not need to be placed at a relatively distant location away from the field to meet predetermined design rules. Alternatively, if low contact resistance is critical, it is preferable to form metal contacts, in all cases, rather than providing the poly-2 layer 120. The use of metal contacts can reduce contact resistance by up to 50%. In a multi-level polysilicon process, i.e. where more than one layer of polysilicon is used, an additional mask is needed to selectively dope the polysilicon where a low-resistance region is desired. In which case, at least one of the polysilicon layers may be optionally plated with silicide by either a deposition process known in the art or by thermally reacting metal with the polysilicon. A silicide coating serves to enhance the conductivity of the polysilicon layer.

In a single poly process, (i.e., one that does not use poly-2, but instead only uses metal contacts to substrate), the design rules for contact-to-field sparing must be relaxed to place the contact sufficiently away from the field to avoid creating a short between the contact and the field region or the contact and the gate. Of course, the advantages of using only a single polysilicon layer is that fewer mash are required and lower resistivities in the final product are obtained.

Proceeding with FIG. 15, a layer of undoped oxide is conformally deposited on the structure and then a doped oxide layer is deposited thereon. Preferably, the doped oxide layer is borophosphosilicate glass (BPSG). More preferably, a thick layer (approximately 5000 Å to approximately 10,000 Å) of BPSG (110) is deposited and then annealed. Annealing is performed to flow and stabilize the BPSG layer (110). A contact mask (125) is applied above the thick layer of BPSG and patterned to define contact areas. A combination of a wet and a dry etch is performed to form the contact holes shown in FIG. 15.

Contact implants may be provided to minimize the contact resistance and the design rules for contact-to-field spacing in conventional processes. However, the invention does not require contact implants in order to operate.

Figure 16:
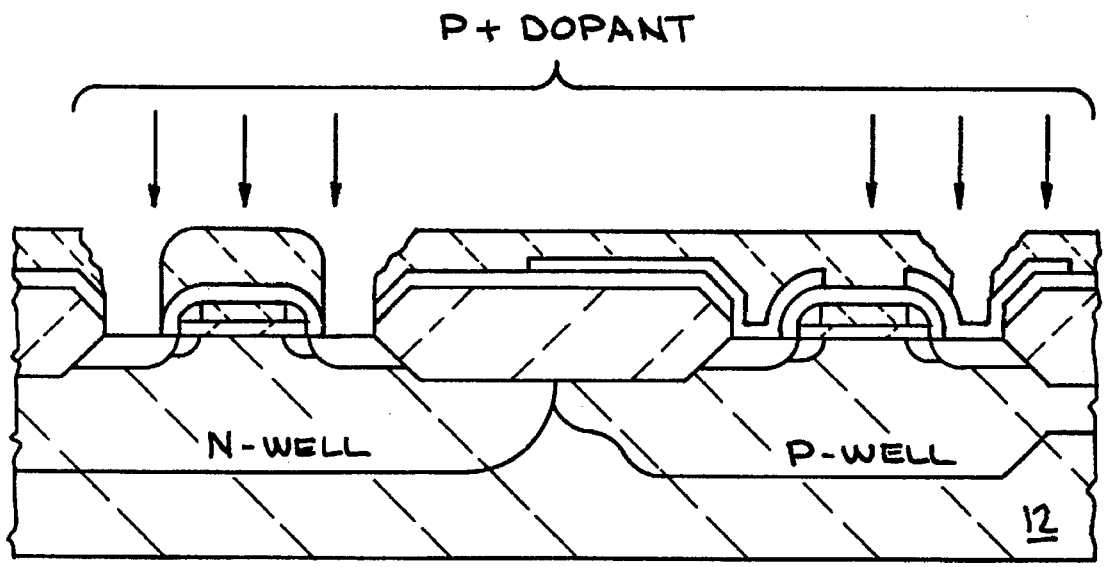
Figure 17:
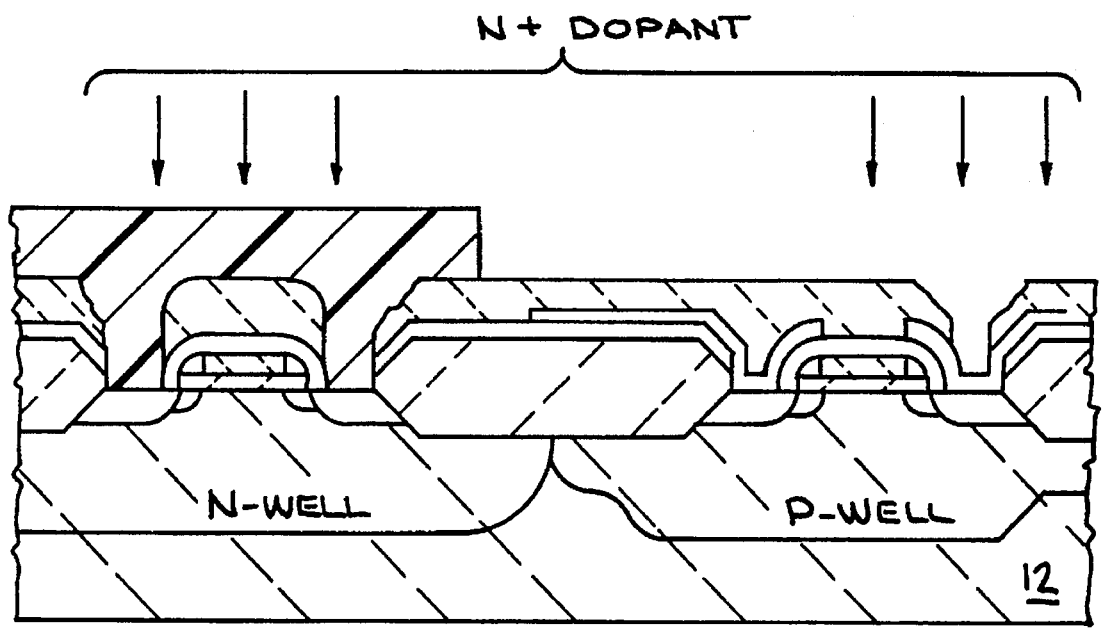
Figure 18:
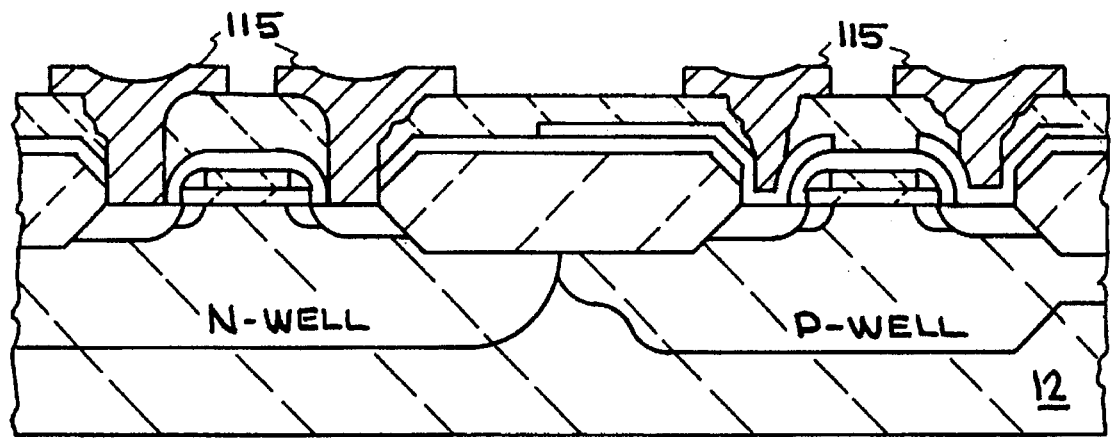

Dopant is optionally introduced into the contact holes (106), when it is desired to dope the contact openings. Specifically, the contact hole that contacts a well of a first conductivity type will receive a different dopant than the well having a net second conductivity type. In other words, both p+ and n+ contacts receive p-type and n-type implants respectively. One way of performing the optional step of reducing contact resistance is to introduce dopant into contact holes as shown in FIG. 16. Turning to FIG. 17, dopant of a second conductivity type is then introduced into the contact hole touching source and drain regions of a second conductivity type to thereby decrease the contact resistance in the contact areas (not shown) located within the source and drain regions. Alternatively, a low dose blanket implant of one conductivity type may be sufficient to comply with predetermined contact resistance specifications desired for regions of one conductivity type. In this alternative embodiment, the dose levels should be low enough to avoid increasing the contact resistance in the region of the other conductivity type as well. In a preferred embodiment, boron will be used at a dose of approximately 3E14 atoms/cm$^2$ to 6E14 atoms/cm$^2$ to minimize the increase in contact resistance. Metal (115) is then sputter deposited into the contact holes and then patterned to form the structure shown in FIG. 18. Additional metal layers may be deposited in a conventional manner after the first metal layer (115) is deposited into the contact holes. Thereafter a passivation layer may be deposited.

The present process forms an LDD structure using only 7 masks up to and including the passivation layer. In addition, the present invention also provides the advantage of source/drain junctions that are as deep as or shallower than those formed from a lower dose p-type dopant implant alone. As a result, a shallow p+ source/drain junction is possible that improves both isolation between p+ regions and punch-through suppression under the gate. This is due to the n-type dopant substantially suppressing the diffusion of the p-type dopant as shown by the profiles of both types of dopants in FIG. 19.

Figure 19:
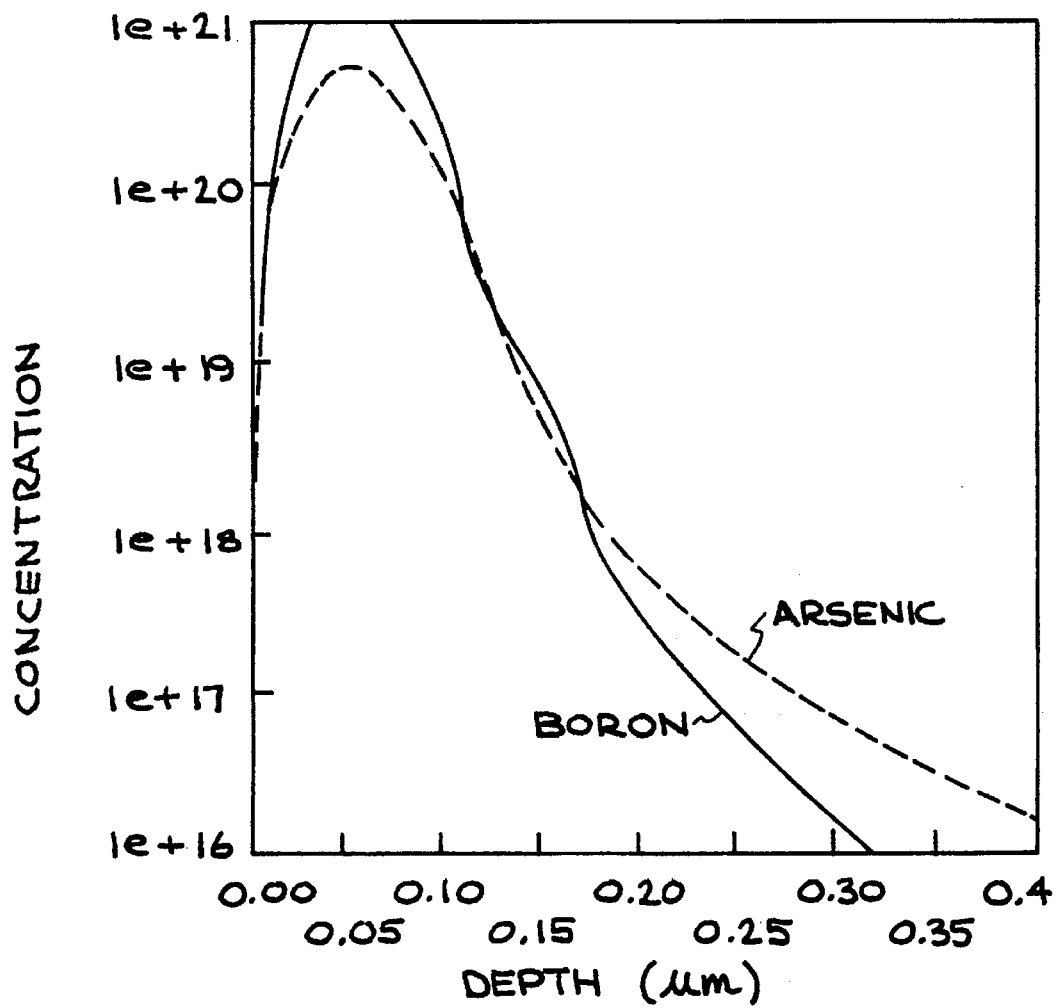
FIG. 19 is a plot illustrating the dopant profiles of arsenic and boron as a function of concentration and depth.

FIG. 19 is a plot of concentration of dopant in cubic centimeters versus the depth at which the dopant penetrates the substrate in micrometers. The presence of an n-type dopant limits the diffusion of p-type dopant, and the profile of the p-type concentration is thereby substantially confined within the profile of the n-type dopant.

Although several illustrations of various embodiments of the invention have been described, it is understood that the invention is not limited to the specific examples or embodiments disclosed. Indeed, one skilled in the art can readily appreciate that the invention as described above is capable of various modifications. For example, the specific conductivity types presented in the described embodiments can be reversed to achieve similar results.

What is claimed:

1. A method of forming LDD source and drain regions for a CMOS structure commencing at a stage where contiguous wells of opposite conductivity, isolation regions and gate structures have been formed in a semiconductor substrate, said process comprising the steps of:
   a) introducing a first dosage of a dopant of a first conductivity type into both of said contiguous wells to form source and drain regions;
   b) forming disposable side-wall spacers adjacent to at least one of said gate structures;
   c) introducing a second dosage, higher than said first dosage, of a dopant of said first conductivity type into both wells to form heavily-doped source and drain regions;
   d) introducing a high dosage of a dopant of a second conductivity type in one of said wells to convert the source and drain regions in said one well to heavily-doped source and drain regions of said second conductivity type;
   e) removing said disposable spacers from one of said gate structures; and
   f) providing a low dosage source and drain implant of a dopant of said second conductivity type in areas adjacent to said heavily-doped source and drain regions of said second conductivity type.

2. The method of claim 1, wherein said spacers contain a phosphorus dopant.

3. The method of claim 1, wherein at least one of said wells is a retrograde well.

4. The method of claim 3, wherein said retrograde well is formed by selectively implanting said substrate with a p-type dopant to form a p-well, or an n-type dopant to form an n-well.

5. The method of claim 4, wherein during formation of said retrograde well, one or more implants of a charged boron ion is introduced into said substrate to form a retrograde p-well.

6. The method of claim 4, wherein during formation of said retrograde well, one or more implants of an n-type dopant is selected from the group consisting of phosphorus, arsenic or antimony to form a retrograde n-well.

7. The method of claim 4, wherein said p-type dopant or said n-type dopant is provided in more than one implant at different energies, with lower energy implants preceding higher energy implants.

8. The method of claim 1, wherein a mask is used during step d) to allow said dopant of said second conductivity to be introduced.

9. The method of claim 8, wherein said mask is used during step f) to prevent said low dosage implant from entering areas of said semiconductor substrate adjacent regions where said spacers remain.

10. The method of claim 8, further comprising providing an oxide layer above a surface of said gate structure.

11. The method of claim 10, wherein said oxide layer is etched to form an opening over a source or drain region, and a polysilicon layer is conformally deposited on said etched oxide layer.

12. The method of claim 11, further comprising removing a portion of said polysilicon layer.

13. The method of claim 10, wherein said oxide layer is undoped.

14. The method of claim 10, further comprising depositing a doped oxide layer above said undoped oxide layer.

15. The method of claim 12, further comprising depositing a doped oxide layer above said undoped oxide layer.

16. The method of claim 14, wherein said doped oxide layer is annealed.

17. The method of claim 14, further comprising removing a portion of said doped oxide layer and said undoped oxide layer to form contact openings exposing source or drain regions.

18. The method of claim 17, further comprising introducing a dopant of a first conductivity type into said contact openings.

19. The method of claim 18, wherein a dopant of a second conductivity type is introduced into a portion of said contact openings to convert said portion to a conductivity opposite said first conductivity type.

20. A method for fabricating a CMOS structure comprising the steps of:
  a) forming an N-type region in an upper stratum of a substrate;
  b) forming a P-type region within said upper stratum;
  c) forming a screening layer on said substrate;
  d) forming gate structures over said substrate;
  e) introducing a light implant into said N-type region and said P-type region;
  f) forming spacers on lateral edges of each gate structure;
  g) providing a heavy dose of a first conductivity type dopant to form doped regions wherein said N-type and P-type regions;
  h) producing a heavy dose of a second conductivity type dopant within a portion of said upper stratum; and
  i) introducing a light implant of said second conductivity type dopant into said portion of said upper stratum.

21. The method of claim 20 wherein after step a) an anti-punchthrough implant is provided in said N-type region or skid P-type region.

22. The method of claim 21 wherein said anti-punchthrough implant comprises singly- and doubly-charged boron ions.

23. The method of claim 20 wherein a mask is used during step h).

24. The method of claim 20 wherein spacers adjacent to at least one of said gate structures are disposable.

25. The method of claim 24, wherein said spacers contain phosphorus dopant.

26. The method of claim 20, wherein said screening layer is formed prior to step b).

27. The method of claim 20, wherein said screening layer constitutes isolation regions.

28. The method of claim 27, wherein said isolation regions are formed by local oxidation.

29. The method of claim 23, further comprising providing an oxide layer above a surface of said gate structure.

30. The method of claim 29, wherein said oxide layer is etched to form an opening over a source or drain region, and a polysilicon layer is conformally deposited on said etched oxide layer.

31. The method of claim 30, further comprising removing a portion of said polysilicon layer.

32. The method of claim 20, wherein said oxide layer is undoped.

33. The method of claim 20, further comprising depositing a doped oxide layer above said undoped oxide layer.

34. The method of claim 30, further comprising depositing a doped oxide layer above said undoped oxide layer.

35. The method of claim 32, wherein said doped oxide layer is annealed.

36. The method of claim 32, further comprising removing a portion of said doped oxide layer and said undoped oxide layer to form contact openings exposing source or drain regions.

37. The method of claim 32, further comprising introducing a dopant of a first conductivity type into said contact openings.

38. The method of claim 37, wherein a dopant of a second conductivity type is introduced into a portion of said contact openings to convert said portion to a conductivity opposite said first conductivity type.

39. A method for fabricating a CMOS structure comprising the steps of:
  a) forming an N-type region in an upper stratum of a substrate;
  b) forming a P-type region within said upper stratum;
  c) forming a screening layer on said substrate;
  d) forming gate structures over said substrate;
  e) introducing a light implant into said N-type region and said P-type region;
  f) forming spacers on lateral edges of each gate structure;
  g) after step (e) providing a heavy dose of a first conductivity type dopant to form doped regions of a greater depth than a doped region formed by a previous implantation within said N-type and P-type regions;
  h) producing a heavy dose of a second conductivity type dopant within a portion of said upper stratum; and
  i) introducing a light implant of said second conductivity type dopant into said portion of said upper stratum.

* * * * *